(12) United States Patent
Heideman et al.

(10) Patent No.: US 7,835,417 B2
(45) Date of Patent: Nov. 16, 2010

(54) NARROW SPECTRUM LIGHT SOURCE (75) Inventors: Rene Gerrit Heideman, Oldenzaal (NL); Edwin Jan Klein, Enschede (NL)

(73) Assignee: Octrolix BV (NL)

( * ) Notice: Subject to any disclaimer, the term of this patent is extended or adjusted under 35 U.S.C. 154(b) by 198 days.

(21) Appl. No.: 12/173,713

(22) Filed: Jul. 15, 2008

(65) Prior Publication Data
US 2010/0014544 A1 Jan. 21, 2010

(51) Int. Cl.
*H01S 3/083* (2006.01)
*H01S 3/10* (2006.01)
*H01S 5/00* (2006.01)
*G02B 6/42* (2006.01)

(52) U.S. Cl. .................. 372/94; 372/20; 372/50.124; 385/39; 385/27

(58) Field of Classification Search .................. 372/94, 372/20, 50.124; 385/39, 27
See application file for complete search history.

(56) References Cited

U.S. PATENT DOCUMENTS

| 6,568,105 | B1 | 5/2003 | Asami | |
| 6,690,687 | B2* | 2/2004 | Ksendzov et al. | 372/20 |
| 2005/0013529 | A1* | 1/2005 | Chiu et al. | 385/15 |
| 2005/0058396 | A1* | 3/2005 | Tormen et al. | 385/39 |
| 2006/0215713 | A1* | 9/2006 | Flanders et al. | 372/20 |

* cited by examiner

*Primary Examiner*—Minsun Harvey
*Assistant Examiner*—Patrick Stafford
(74) *Attorney, Agent, or Firm*—DeMont & Breyer, LLC (57) ABSTRACT An apparatus and method are disclosed for decreasing the spectral bandwidth of a semiconductor laser, such as a vertical cavity surface emitting laser.

16 Claims, 6 Drawing Sheets

NARROW SPECTRUM LIGHT SOURCE

FIELD OF THE INVENTION

The present invention relates to integrated optics and VCSELs.

BACKGROUND OF THE INVENTION

Lasers are ubiquitous; they are used for many different purposes and in a variety of applications. One type of semiconductor laser that has recently garnered much attention is the vertical cavity surface emitting laser, commonly known by the acronym "VCSEL."

Semiconductor diode-lasers comprise a plurality of layers of semiconductor material that is sandwiched between two "mirrors." Photon generation occurs principally in an optical gain region, where charge carriers (i.e., electrons and holes) from n- and p-doped regions of the device combine and emit energy as photons. The mirrors force most of these emitted photons to return through the gain region. As they do, the photons stimulate the recombination of other charge carriers, which in-turn generates more photons. These newly generated photons are characterized by the same wavelength as the photons that stimulated their emission.

The mirrors and gain region collectively define a "laser cavity." Light is emitted from the laser cavity by virtue of the fact that the mirrors are not one-hundred percent reflective, which enables some photons to escape the laser cavity as emitted light. In the more conventional "edge-emitter," the laser cavity is in the plane of the junction layer and light is emitted parallel to the substrate surface. In contrast, the mirrors that define the laser cavity in a VCSEL are disposed above and below the junction layer. As a consequence, the VCSEL comprises a "vertical cavity," and light is emitted in a direction that is perpendicular to the substrate surface.

By virtue of its geometry, the VCSEL offers numerous performance, manufacturability, and cost advantages over conventional edge-emitting lasers in some applications. Advantages include:

A single VCSEL is the smallest commercially available semiconductor laser diode type. Each individual laser fits on a chip area smaller than 0.25 to 0.25 mm. And most of that area is used for electrical contacts and marking. The intrinsic diameter of the active laser is smaller then that of a human hair. This enables mass market production similar to the technology used in the silicon industry.

The structure can easily be monolithically integrated in one- and two-dimensional array configurations.

Low threshold currents enable high-density arrays (Terabit aggregate communication).

Surface-normal emission and a geometry that is nearly identical to a photo detector results in simplified alignment and packaging.

Low-cost potential because the devices are completed and tested at the wafer level.

Circular and low divergence output beams eliminate the need for corrective optics.

Lower temperature-sensitivity compared to edge-emitting laser diodes.

High transmission speed with low power consumption.

VCSELs provide enhanced performance benefits for many applications, such as local area networks (LAN), optical wireless, telecommunication switches, optical storage, sensing applications, gas detection, absorption spectroscopy, night vision, homeland security applications, military applications (e.g., range finding and target localization, etc.), medical applications (e.g., low-level laser therapy, etc.), and automotive data communications, among others. In fact, VCSELs are the light emitter of choice for high-performance fiber data communications (speeds much higher than 1 Gbs) like Gigabit Ethernet.

Notwithstanding its many advantages over other types of coherent light sources, VCSELs do possess characteristics that, for some applications, are disadvantageous. In particular, relative to other lasers, most VCSELs have a relatively broad spectral bandwidth (i.e., about 0.3 nanometers). For some applications, this "broad" spectral bandwidth is unacceptable or otherwise undesirable.

To narrow the spectral bandwidth of a VCSEL, it is known to couple an external mirror, such as a Bragg grating, to a VCSEL. The external-cavity Bragg grating is capable of reducing the spectral bandwidth of the VCSEL to <<0.1 nanometers. But a Bragg grating is relatively expensive to implement and suffers reliability issues (to the extent that the grating is stretched for the purpose of tuning).

U.S. Pat. No. 6,690,687 addresses a similar issue; how to tune (i.e., narrow) the spectral bandwidth of a widely tunable semiconductor laser, such as for use in a dense wavelength division multiplexing ("DWDM") system. This patent discloses a widely tunable semiconductor laser having a cavity with a ring resonator, a Mach-Zehnder interferometer, and tuning elements for both the ring and interferometer. The laser is formed on a III/V material semiconductor "gain" chip. The ring resonator and Mach-Zehnder interferometer reside on a silicon semiconductor "tuning" chip.

The gain chip generates light within about 10 nm of a selected channel (e.g., WDM channel, etc.). In the absence of the tuning chip, the wavelength of the light can vary throughout the tuning range as a function of the applied current. To prevent this variation of wavelength, the ring resonator and Mach-Zehnder tuning port are used.

The ring resonator operates as a fine-tuning device under the control of a fine-tuning control unit (e.g., a heater, etc.) to limit resonance within the laser cavity to a set of sharp resonance peaks within the gain range of the laser. The Mach-Zehnder interferometer operates as a wide-tuning port under the control of a wide-tuning control unit (e.g., a heater, etc.) to limit the resonance within the laser cavity to a profile having a single broad peak. The Mach-Zehnder accomplishes this by effectively selecting one of the plural peaks generated by the ring resonator and suppressing the amplitude of the other peaks. According to the patent, the result is that the laser cavity resonates primarily at the selected emission wavelength and transmission sidebands are substantially reduced.

Although a VCSEL is a semiconductor laser, U.S. Pat. No. 6,690,687 does not contemplate the use of a VCSEL. In this regard, VCSELs do not have a sufficiently broad spectral bandwidth for that application.

Furthermore, there are some formidable problems that would arise if a VCSEL were to be used in such a system. In particular, the issue of how to efficiently launch light that is emitted from a VCSEL into a waveguide must be addressed. The problem here is that although the light emitted from a VCSEL is orthogonal to the substrate, the waveguides for transmitting the light are in the plane (parallel) to the substrate. Launching light from an edge-emitter is far less problematic; it is simply an issue of vertical alignment.

Another problematic issue with VCSELS pertains to their operating wavelength. Most material systems that are useful for waveguides are not transparent at 850 nanometers, which is a common operating wavelength of VCSELs. And most material systems that are useful as waveguides at 850 nanometers have relatively high attenuation.

Inapplicability to VCSELs aside, the arrangement for narrowing the spectral bandwidth of a widely-tunable laser source that is disclosed in U.S. Pat. No. 6,690,687 has a variety of drawbacks.

In particular, the approach adopted in U.S. Pat. No. 6,690,687 is complex, both in terms of components and layout. As to components, that arrangement requires a Mach-Zehnder interferometer and a means to control it, as well as a ring resonator and means to control it. As to layout, the arrangement disclosed in U.S. Pat. No. 6,690,687 is a hybrid system; that is, the laser and "tuning" devices (ring resonator and Mach Zehnder) reside on different chips. This complication has both cost and performance implications.

In particular, as compared to a single chip and/or monolithic system, the hybrid system is substantially more expensive due to labor and materials costs, and problematic due to the necessity for multiple suppliers, not to mention the need to meet various opto-mechanical packaging requirements. Regarding performance, the use of different materials systems—a III/V chip and a silicon chip—means that there will be differences in the thermal expansion of the two chips. This causes alignment problems, which are dealt with by either incurring the expense of special packaging or simply operating with the errors.

The benefits of monolithic integration are well known, but in the context of U.S. Pat. No. 6,690,687, such integration would be very problematic. Among other any other issues, the III/V wafer (on which the laser is grown) is very fragile. If an attempt were made to grow the silicon dioxide/silicon oxynitride waveguide disclosed in U.S. Pat. No. 6,690,687 on a III/V wafer, the stresses that develop in the (relatively thick) waveguides that are being formed would impart strain in the wafer that is almost certain to fracture it. Also, unless the semiconductor is an edge emitter, the previously-mentioned difficultly of coupling light from a VCSEL into a planar waveguide must be addressed.

A need therefore exists for a relatively less complex approach to creating a narrow-spectrum semiconductor laser source, wherein the semiconductor laser can be a VCSEL.

SUMMARY OF THE INVENTION

The present invention provides a narrow-spectrum light source that avoids some of the costs and disadvantages of the prior art.

The tunable laser disclosed in U.S. Pat. No. 6,690,687 required the Mach Zehnder interferometer to filter undesired resonant modes generated by the ring resonator. The reason why these modes required filtering is that they were relatively close, in terms of wavelength, to the "desired" resonant wavelength. The (wavelength or frequency) spacing between adjacent resonant modes is referred to as "free spectral range." The greater the free spectral range, the greater the wavelength separation between adjacent resonances.

The present inventor recognized that it would be desirable to modify U.S. Pat. No. 6,690,687 by using a ring resonator having a large(r) free spectral range than the resonator described in that patent. A ring resonator having a sufficiently large free spectral range would permit the use of the ring resonator without the need for the filtering function provided by the Mach-Zehnder interferometer.

It is known that the free spectral range of a ring resonator is inversely proportional to its size. As a consequence, to provide the large free spectral range required, the ring resonator must have a very small diameter. To guide light around a very small ring resonator requires a waveguide material system that has a very high (refractive) index contrast. The index contrast of a waveguide refers to the ratio of the refractive indices of its core and cladding. Unfortunately, high contrast waveguides generally have relatively high signal attenuation; therefore, they are not suitable for most applications.

The present inventor appreciated that with an appropriate choice of waveguide material, a simply-implemented, VCSEL-based, narrow-spectrum light source could be realized. The inventor recognized that the material system disclosed in U.S. Pat. No. 7,146,087 to Heideman et al. would be quite suitable for this purpose. That material system comprises a multilayer arrangement comprising an inner core of stoichiometric silicon oxide ($SiO_2$), an outer core of stoichiometric silicon nitride ($Si_3N_4$), and a cladding formed from a material (e.g., silicon dioxide, etc.) having an index of refraction that is lower than that of the outer core.

Using this preferred material system enables a narrow-spectrum light source that is far simpler in terms of components and layout than the prior art. In the illustrative embodiment, the narrow-spectrum light source simply comprises a VCSEL and a ring resonator that are optically coupled to one another by waveguides. In the illustrative embodiment, the ring resonator and the waveguides that optically couple the ring resonator to the VCSEL are implemented using the preferred material system. In some embodiments, the narrow spectrum light source is implemented on a single chip. In some embodiments, the narrow spectrum light source is monolithically integrated. The result is a narrow spectrum light source, which can be VCSEL based, that is substantially easier to manufacture and is less costly than the arrangement disclosed in U.S. Pat. No. 6,690,687. And all of these benefits accrue from the use of the preferred material system.

The preferred material system addresses the problems previously discussed to provide an enhanced narrow-spectrum light source as follows:

The preferred material system enables formation of surface waveguides that exhibit a combination of (1) very high index contrast and (2) very low attenuation over a wide range of wavelengths, as compared to alternative surface waveguide material systems that utilize singular core materials such as silicon dioxide, silicon nitride, or silicon oxynitride.

The preferred material system has lower attenuation than alternatives over a wider range of wavelengths, including 850 nanometers, which is a common operating wavelength of VCSELs.

The preferred material system enables formation of surface waveguides having very high index contrast. A high index contrast permits use of a very small ring resonator, such as those having a diameter between about 20 microns to 100 microns, which is much smaller the nominal 300-micron-diameter ring resonator used in U.S. Pat. No. 6,690,687. This is desirable, as previously noted, because free spectral range of a ring resonator is inversely proportional to its size. This increases the free spectral range from about 1.5 nanometers (in U.S. Pat. No. 6,690,687) to about 4 nanometers (at 100 microns) to as much as about 10 nanometers free spectral range (at 20 microns diameter) in the illustrative embodiment of the present invention.

The preferred material system resolves the aforementioned competing requirements that:

(1) the loop waveguide should be formed via a high-contrast waveguide technology so that it can have a small size and thus a large free spectral range;

(2) the port waveguides should be formed via a waveguide technology that enables efficient coupling to the conventional optical fibers typically used in photonic systems, which usually requires a low contrast waveguide; and (3) the effective refractive indices of the loop waveguide and the port waveguides should be as close in magnitude as possible to enable high evanescent field coupling efficiency. As such, it is desirable for the loop waveguides as well as the other waveguides to be out of the same material.

The preferred material system is high contrast, yet it enables efficient coupling. This is accomplished by including a large amount of nitride, but in the form of substantially thinner layers than other material systems. Therefore, using the preferred material system, the loop waveguide and the port waveguides can be formed in the same material system. In addition to resolving the apparent conflict, this reduces fabrication costs.

The preferred material system comprises materials that are stoichiometric. As a result, the mechanical and optical characteristics of these materials are highly repeatable from batch to batch and foundry to foundry.

The preferred material system comprises materials that can be deposited via LPCVD. Most surface waveguides are formed using materials that are not compatible with LPCVD and instead require PECVD. LPCVD is preferred over PECVD because it enables large batch processing, whereas PECVD requires small batch processing (e.g., one or two wafers at a time). Large batch processing can enable significant production cost reductions.

In addition to narrowing the spectral bandwidth of the VCSEL, the ability to the tune the resonant wavelength of the ring resonator (e.g., thermo-optically, electro-optically, etc.) provides an ability to affect small changes to the nominal center wavelength of the VCSEL. This is accomplished by setting the resonant frequency of the ring resonator such that it is not equal to the nominal center frequency of the VCSEL. It is notable that the integrated Bragg gratings of the VCSEL will serve to prevent re-entry into the VCSEL of "off-resonance" light. As a consequence, if an ability to alter the nominal center wavelength of the VCSEL is desired, the external "mirror" (i.e., ring resonator) must have a smaller bandwidth than the VCSEL's integrated Bragg grating.

DETAILED DESCRIPTION

The terms that appear below are provided with the following explicit definitions for use in understanding the specification and interpreting the appended claims:

Free spectral range is the distance (in frequency or wavelength space) between adjacent transmission peaks.

Spectral component refers to optical energy characterized by a particular wavelength, such as is typically present in the emission from a laser. In the context of real-world technological applications, as opposed to a theoretical discussion, a spectral component will never actually be characterized by only a single wavelength. Rather, the electromagnetic spectrum of the spectral component will include a plurality of wavelengths that are centered about a predominant, primary or center wavelength.

Evanescent-coupling relation refers to a relationship between two or more elements, typically optical waveguides, wherein an optical signal traveling through one of the elements is capable of coupling at least some of its optical energy, via evanescent field coupling, into the other element. This relationship implies that the two elements are suitably close to one another so that the evanescent field from an optical signal traveling through one of the elements extends into the other element.

Other definitions may appear throughout this specification as appropriate.

In the illustrative embodiment of the present invention, a ring resonator is coupled to a VCSEL in such a way as to narrow the emission spectra of the VCSEL. There are many different types of VCSELs, but all VCSELs have certain common features. For example, VCSELs typically include semiconductor active regions, mirrors (typically Bragg reflectors), current confinement structures, substrates, and electrical contacts. And a common characteristic is that VCSELs emit light perpendicular to a wafer's surface.

Furthermore, the cavity length of a VCSEL is very short, typically 1-3 wavelengths of the emitted light. As a consequence, in a single pass of the cavity, a photon has a relatively small chance of triggering a stimulated emission event at low carrier densities. Due to the small chance of triggering a stimulated emission, VCSELs require highly reflective mirrors to be efficient. By way of comparison, in edge-emitting lasers, the reflectivity of the facets is about 30%, whereas the reflectivity required for low threshold currents in VCSELs is greater than 99.9%. Such a high reflectivity can not be achieved by the use of metallic mirrors; rather, VCSELs use Distributed Bragg Reflectors. (DBRs). DBRs are formed by depositing alternating layers of semiconductor or dielectric materials with a difference in refractive index.

VCSELs can be formed from a wide range of material systems to exhibit different output characteristics. For example, although VCSELs typically emit at 850 nanometers, material systems can be tailored to produce laser wavelengths at 1550 nm, 1310 nm, 780 nm, 670 nm, and so forth.

The illustrative embodiment of the invention comprises a VCSEL as a broad spectral bandwidth source. Creating such a VCSEL-based system has proven, until now, to be exceedingly problematic. It is to be understood, however, that the present invention can be practiced using other types of semiconductor lasers.

Figure 1:
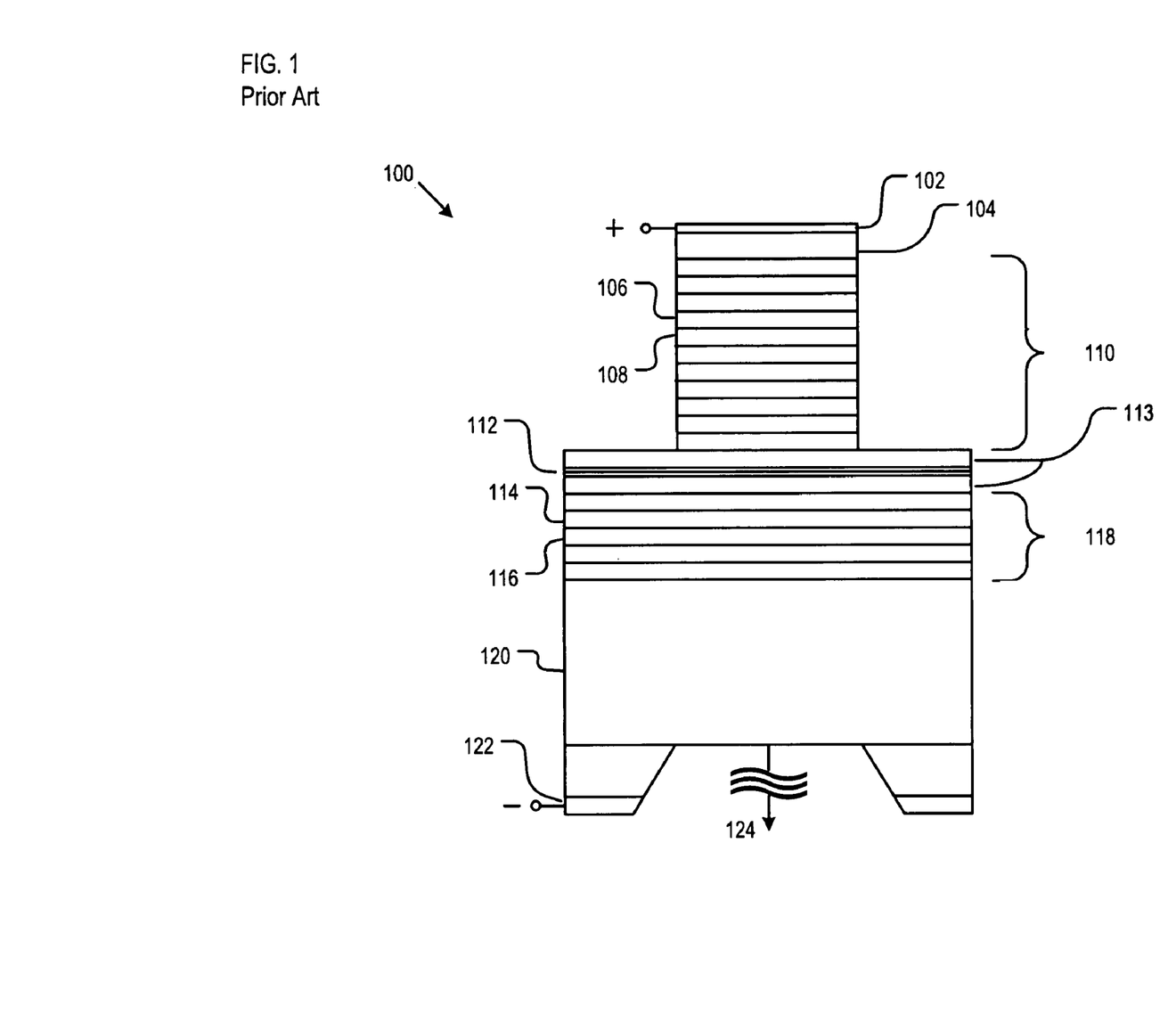
FIG. 1 depicts a prior-art vertical cavity surface emitting laser ("VCSEL").

FIG. 1 depicts a simplified illustration of typical prior-art VCSEL 100, which is but one example of a VCSEL that can used in conjunction with the present invention. VCSEL 100 consists of two distributed Bragg reflector (DBR) mirrors 110 and 118 that are parallel to the wafer surface and flank active region 112.

Upper mirror 110 consists of layers 106 and 108 with alternating high and low refractive indices. Likewise lower mirror 118 consists of layers 114 and 116 with alternating high and low refractive indices. These layers have a thickness of a quarter of the laser wavelength in the material.

In the embodiment that is depicted in FIG. 1, VCSEL 100 emits light 124 from its bottom surface; therefore, lower mirror 118 must have a somewhat lower reflectivity than upper mirror 110. This is accomplished by providing fewer layers in lower mirror 118 than upper mirror 110. For example, in some embodiments, upper mirror 110 comprises thirty periods of p-type AlGaAs/GaAs and lower mirror 118 comprises seventeen and one-half periods of n-type AlGaAs/GaAs.

The AlGaAs/GaAs system is favored for constructing VCSELs because the lattice constant of the material does not vary strongly as the composition is changed, permitting multiple lattice-matched epitaxial layers to be grown on a GaAs substrate. The refractive index of AlGaAs does vary relatively strongly as the Al fraction is increased, thereby minimizing the number of layers required to form an efficient Bragg mirror compared to other candidate material systems. Furthermore, at high aluminum concentrations, an oxide can be formed from AlGaAs, and this oxide can be used to restrict the flow of current in a VCSEL, enabling very low threshold currents.

In typical VCSELs, such as VCSEL 100, the upper and lower mirrors are doped as p-type and n-type materials, forming a diode junction. In more complex VCSEL structures, the p-type and n-type regions may be buried between the mirrors, requiring a more complex semiconductor process to make electrical contact to the active region, but eliminating electrical power loss in the DBR structure.

Mirrors 110 and 118 sandwich active region 112. The active region typically comprises a plurality of quantum wells and associated layers. For example, in some embodiments, active region 112 comprises (from top to bottom), a confinement layer of AlGaAs having a thickness of about 120 nanometers, a plurality of alternating quantum well layers and quantum well barrier layers (quantum well layers comprising InGaAs and having a thickness of 8 nanometers, quantum well barrier layers comprising GaAs and having a thickness of 8 nanometers) and a second confinement layer of AlGaAs.

Spacer layers 113 are disposed above and below active region 112. These spacers control the length of the VCSEL cavity, and thus select the longitudinal mode and the output wavelength.

Electrical contacts layers 104 and 102 are formed on upper mirror 110. Contact layer 104 comprises p-type substrate material (e.g., typically GaAs) and contact layer 102 comprises metal. Lower mirror 118 is formed on substrate 120, typically n-type GaAs. There is a metal contact layer 122 beneath substrate 120.

It should be understood that FIG. 1 illustrates a typical VCSEL and that numerous variations are possible. For example, the doping of the various layers can be changed, a wide range of material systems can be used, operational details can be tuned for specific performance goals, and additional structures, such as tunnel junctions, can be added. These various embodiments of a VCSEL are all suitable for use in conjunction with the present invention. It is important, however, that the material system chosen for the waveguides is transparent to the light that is emitted from the VCSEL, in addition to any other concerns (e.g., attenuation, scalability, etc.). But VCSEL 100 illustrates a useful, common, and exemplary if simplified VCSEL configuration.

As previously noted, in the illustrative embodiment of the present invention, a VCSEL, such as VCSEL 100, is optically coupled to a ring resonator. A ring resonator consists of a closed-loop waveguide and one, or more typically two, linear waveguides. The linear waveguides are usually termed "port waveguides" or "waveguide buses;" the former phrase will be used herein.

Certain frequencies of light resonate within the loop waveguide and, as a consequence of resonator geometry, resonant light couples between the loop waveguide and the linear waveguides. The ring resonator therefore effectively functions as a highly-selective wavelength-dependent optical coupler. A device that is functionally identical to the ring resonator is the disk resonator. The difference is that rather than incorporating a ring or loop waveguide, the disk resonator includes a solid disk waveguide. Either can be used in conjunction with embodiments of the present invention.

In most implementations, light energy is coupled into and out of the micro-resonator's loop waveguide via evanescent field coupling. An evanescent optical field is the portion of the optical field of guided light that extends beyond the physical surface of a waveguide core. In this coupling mode, the loop waveguide is placed in close proximity to both of the linear waveguides. All of the light at the resonant wavelength is eventually transferred from one linear waveguide to the other linear waveguide. Light within a linear waveguide that is off-resonance (i.e., not at the resonance wavelength) bypasses the loop with only a small transmission loss.

The shape of the "loop" of the closed-loop waveguide is typically circular, oval or elliptical, but can alternatively have an arbitrarily curved circumference in the form of a distorted ring. The loop waveguide used in conjunction with the present invention will typically have a circular shape to minimize its size, but any of the aforementioned geometries can suitably be used.

Ring resonators are typically fabricated in one of two arrangements: "laterally coupled" or "vertically-coupled." In a laterally coupled ring resonator, the port waveguides are in the plane of the loop waveguide. In a vertically-coupled resonator, the port waveguides are situated either both above, both below, or one above and one below the loop waveguide. Each of these two basic arrangements has well-understood advantages and drawbacks. Either arrangement can be used in conjunction with the present invention.

Figure 2:
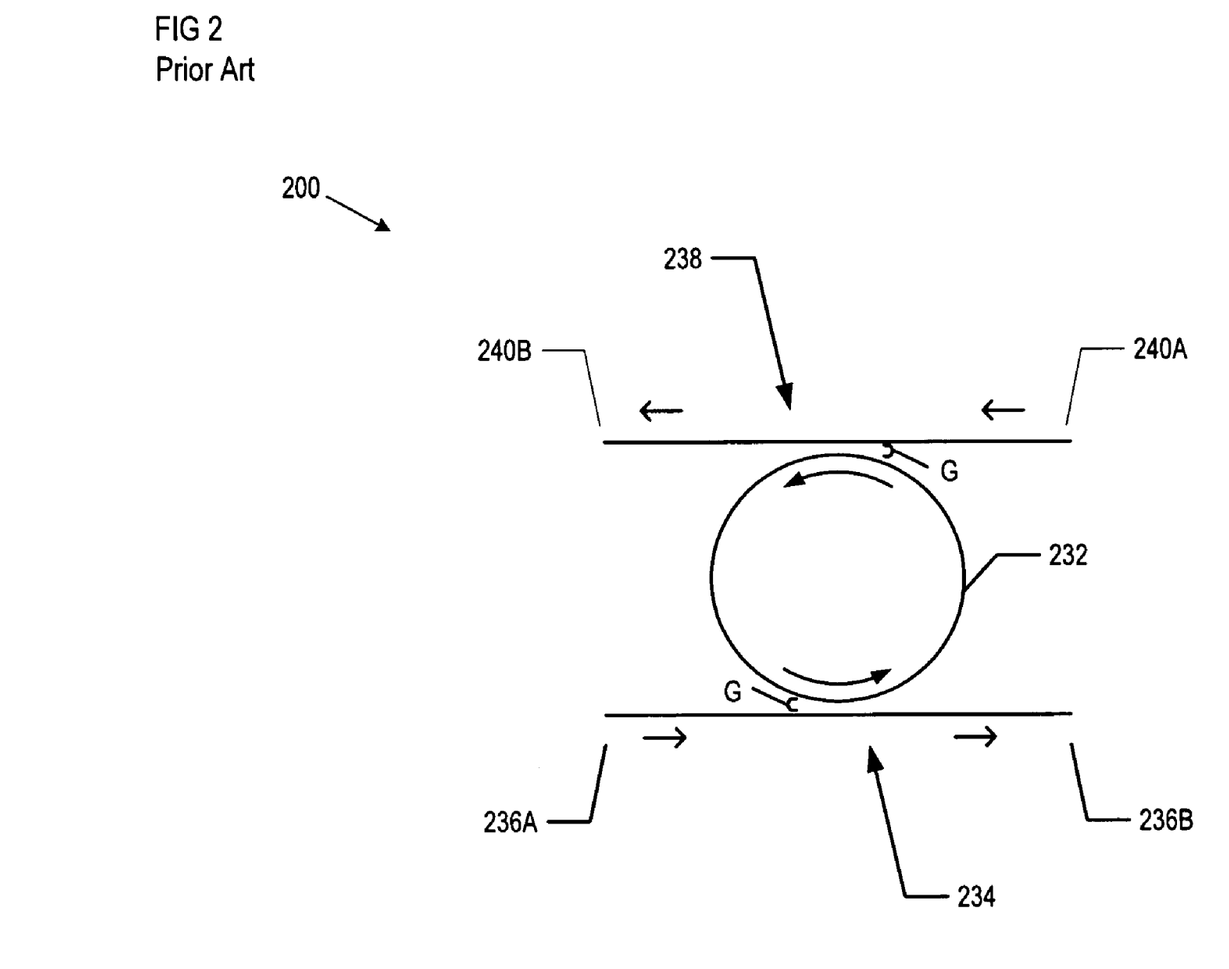
FIG. 2 depicts a prior-art ring resonator.

FIG. 2 depicts a schematic representation of a typical prior-art laterally coupled ring resonator 200. The ring resonator includes closed-loop waveguide 232 and two port waveguides 234 and 238. In the embodiment that is depicted in FIG. 2, ring resonator 200 has four ports: input port 236A and pass port 236B defined on port waveguide 234 and add port 240A and drop port 240B defined on port waveguide 238.

A portion of each of port waveguides 234 and 238 is adjacent and tangential (i.e., in the direction of a tangent) to loop waveguide 232. At this portion of the port waveguides, they are separated from loop waveguide 232 by gap G. This gap is small enough to permit evanescent field coupling, as previously discussed. In some embodiments, this gap is filled with air or one or more materials having a refractive index that is higher than air.

In some alternative implementations (not depicted), respective portions of each of waveguides 234 and 238 that are adjacent to loop waveguide 232 are not tangential thereto; rather, they curve around a portion of loop waveguide 232 to increase the interaction length (for coupling). In some further implementations, a vertically-coupled ring resonator includes port waveguides that are disposed orthogonally to one another (see, e.g., U.S. Pat. No. 6,411,752).

Certain wavelengths of light resonate within loop waveguide 232 as a function of loop characteristics. Consider a multi-wavelength optical signal propagating in port waveguide 234 past input port 236A. Light that has a wavelength that is off-resonance with loop waveguide 232 bypasses the loop and is output from pass port 236B of port waveguide 234. Light that has a wavelength that is on-resonance couples to loop waveguide 232 via evanescent field coupling. As used in this specification and the appended claims, when "light" or a "spectral component" is described as being "off-resonance," it means that the wavelength of the light or spectral component is different from a resonant wavelength of loop waveguide 232. Similarly, when light or a spectral component is described as being "on-resonance," it means that the wavelength of the light or spectral component is the same as a resonant wavelength of loop waveguide 232.

The on-resonance light that is coupled from port waveguide 234 propagates in loop waveguide 232 and couples to port waveguide 238 via evanescent field coupling. The light that is coupled into port waveguide 238 propagates in a direction opposite to the light traveling in port waveguide 234 due to the respective orientations of the various waveguides. As a consequence, the resonant light coupled to port waveguide 238 from port waveguide 234 via loop waveguide 232 will be output from drop port 240B. This resonant light will be joined by off-resonance light that propagates along waveguide 238 from add port 240A.

In analogous fashion, on-resonance light traveling in port waveguide 238 via add-port 240A couples to loop waveguide 232. That light couples to port waveguide 234 and propagates through pass-port 236B, along with off-resonant light from input port 236A. In the arrangement that is depicted in FIG. 2, ring resonator 200 is operated so that light propagates unidirectionally—in this example in a counterclockwise direction—through loop waveguide 232.

Figure 3:
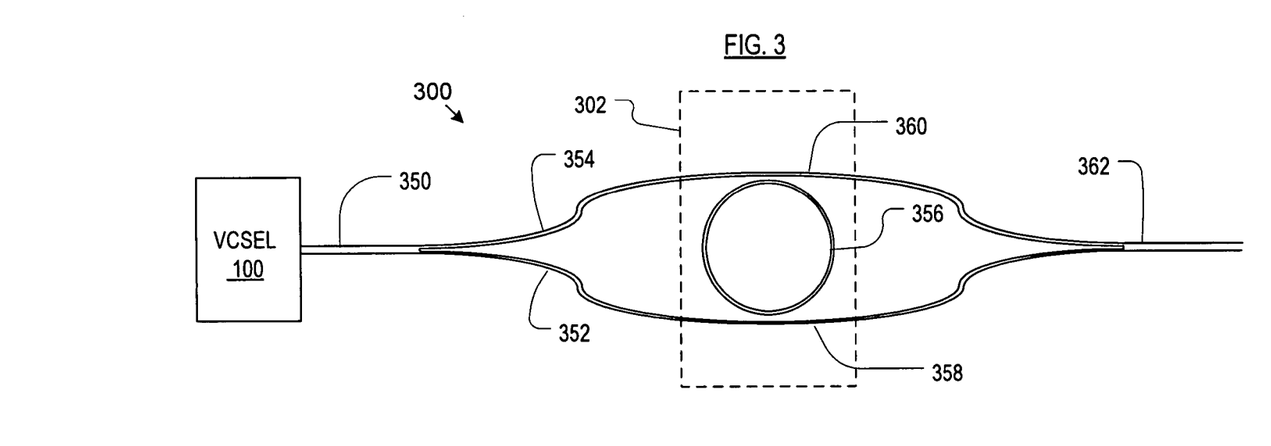
FIG. 3 depicts a narrow spectrum light source in accordance with the illustrative embodiment of the present invention, wherein the narrow spectrum light source incorporates a VCSEL.
Figure 4:
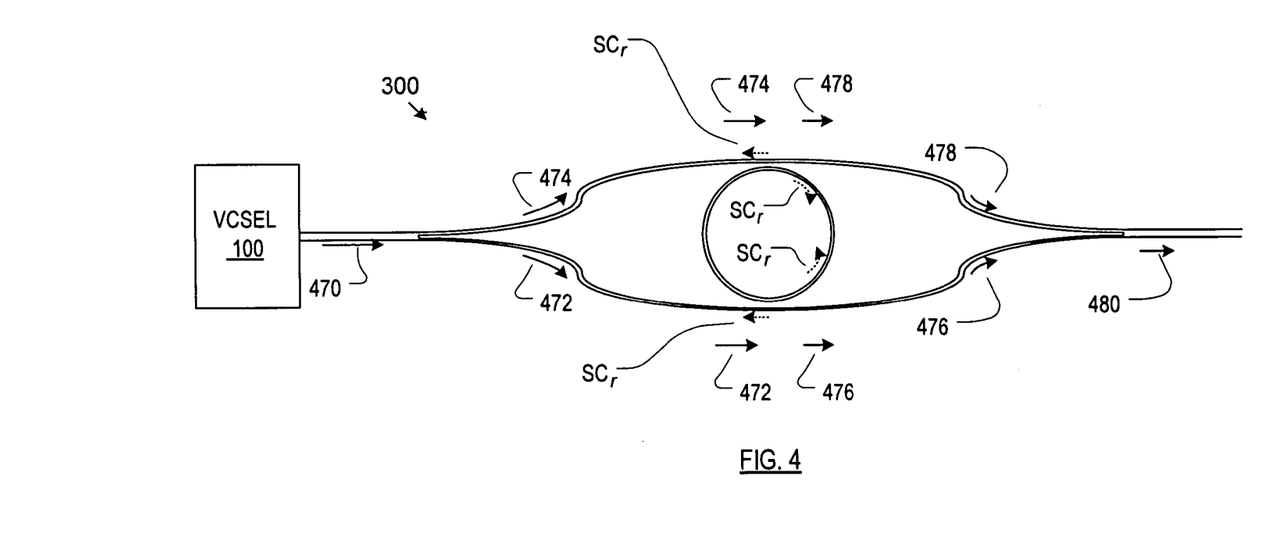
FIG. 4 depicts initial operation of the narrow spectrum light source of FIG. 3.

FIGS. 3 and 4 depict narrow spectrum light source ("NSLS") 300 in accordance with the illustrative embodiment of the present invention. The NSLS incorporates a VCSEL and a ring resonator. FIG. 3 depicts NSLS 300 and FIG. 4 depicts the initial operation of NSLS 300 illustrating, in particular, the propagation of light during the initial nanoseconds of operation.

As depicted in FIG. 3, NSLS 300 comprises VCSEL 100 and ring resonator 302. The ring resonator comprises closed-loop waveguide 356 and port waveguides 358 and 360. VCSEL 100 and ring resonator 302 are optically coupled to one another via various waveguides (and via the operation of ring resonator 302).

NSLS 300 includes waveguides 350, 352, 354, and 362. In the illustrative embodiment that is depicted in FIG. 3, these waveguides are arranged in a "splitter/combiner" layout. In particular, waveguide 350 couples to two waveguides 352 and 354. These two paired waveguides later couple to a single waveguide 362. An optical splitter (not depicted), is situated at the junction of waveguides 350, 352, and 354. Conversely, an optical combiner (not depicted), is situated at the junction of waveguides 352, 354, and 362. For convenience, this arrangement of waveguides is referred to in this specification and the appended claims as "a splitter/combiner waveguide structure."

Port waveguides 358 and 360 are actually a part of respective waveguides 352 and 354. It should be understood that the port waveguides are not distinct from waveguides 352 and 354. They identified as such in this specification solely for pedagogical purposes.

Closed-loop waveguide 356 is disposed between waveguides 352 and 354. Waveguides 352 and 354 are sufficiently close to loop waveguide 356 to create an evanescent-coupling relation therewith.

VCSEL 100 is intended to represent a conventional VCSEL, such as depicted in FIG. 1. It is to be understood that virtually any type of VCSEL can be used as the emitter in NSLS 300.

Ring resonator 302 is arranged somewhat differently than the prior-art ring resonator 200 that is depicted in FIG. 2. As described further below, ring resonator 302 receives counter-propagating spectral components, whereas in the ring resonator of FIG. 2, the spectral components that are coupled to the ring resonator from the port waveguides are routed in unidirectional fashion through the loop waveguide.

In some embodiments, as facilitated by the preferred material system, ring resonator 302 has a diameter that is a range of between about 20 to 100 microns. This endows ring resonator 302 with a free spectral range that is in a range of between about 4 nanometers (at 100 microns diameter) to about 10 nanometers (at 20 microns diameter). This enables NSLS 300 to operate without the need to filter to the output of ring resonator 302, such as is required in the prior art.

FIG. 4 depicts the first few nanoseconds of operation of NSLS 300 by showing the propagation of light throughout. For clarity, the reference numbers or "call-outs" that identify the various waveguides are omitted from FIG. 4; the reader is referred to companion FIG. 3 for such references.

As depicted in FIG. 4, light beam 470 emitted from VCSEL 100 couples to waveguide 350. Beam 470 comprises a plurality of spectral components that define the emission spectrum of the beam. Although there will be one predominant spectral component—the center wavelength $\lambda_c$—power will be distributed over other spectral components near the center wavelength.

Beam 470 is split into two substantially equal-power beams 472 and 474 at the junction of waveguides 352 and 354 in known fashion. Beam 472 propagates through waveguide 352 and beam 474 propagates through waveguide 354.

As beams 472 and 474 approach closed-loop waveguide 356, on-resonance spectral component $SC_r$ from each beam couples to loop waveguide 356. In some embodiments, the resonant wavelength of loop waveguide 356 is set (i.e., designed and actively tuned) to be the desired operating wavelength of VCSEL 100, which is typically $\lambda_c$, the center wavelength.

On-resonance spectral component $SC_r$ is dropped from beam 472, thereby forming beam 476, which continues along waveguide 352. Likewise, on-resonance spectral component $SC_r$ is dropped from beam 474, thereby forming beam 478, which continues along waveguide 354. Beams 476 and 478 are combined at the junction of waveguides 352 and 354 and are launched into waveguide 362.

n-resonance spectral component $SC_r$ that couples to loop waveguide 356 from waveguide 472 proceeds around the loop in a counterclockwise direction and couples to waveguide 474 heading back toward the VCSEL 100. On-resonance spectral component $SC_r$ that couples to loop waveguide 356 from waveguide 474 proceeds around the loop in a clockwise direction and couples to waveguide 472 heading back toward the VCSEL 100. The on-resonance spectral component $SC_r$ propagating along each of the waveguides are combined in known fashion, launched into waveguide 470, and fed back to VCSEL 100.

The on-resonance spectral component $SC_r$ is amplified in VCSEL 100 (since the on-resonance spectral component is at the operating wavelength of VCSEL 100). This "feedback" has the effect of narrowing the spectral bandwidth of the output of the VCSEL, effectively emphasizing the wavelengths contained in on-resonance spectral component $SC_r$. This phenomenon, which is well understood, occurs in a very brief period of time (i.e., nanoseconds to milliseconds).

It is to be understood that ring resonator 302 will have a plurality of discrete resonant wavelengths, separated from one another as given by the free spectral range of the resonator. All such wavelengths are properly described as "on-resonance spectral components." In accordance with the illustrative embodiment, only one such on-resonance spectral component will be amplified in VCSEL 100 due to the relatively large free spectral range of resonator 302. That is, the wavelength of these other spectral components are sufficiently remote from the nominal operating wavelength of VCSEL 100 that they will not affect the operation of VCSEL 100.

It is to be understood that once the VCSEL operation has stabilized, the light beams propagating past loop waveguide 356 will have a reduced spectral bandwidth with most of the power at $\lambda_c$, the center wavelength.

Figure 5:
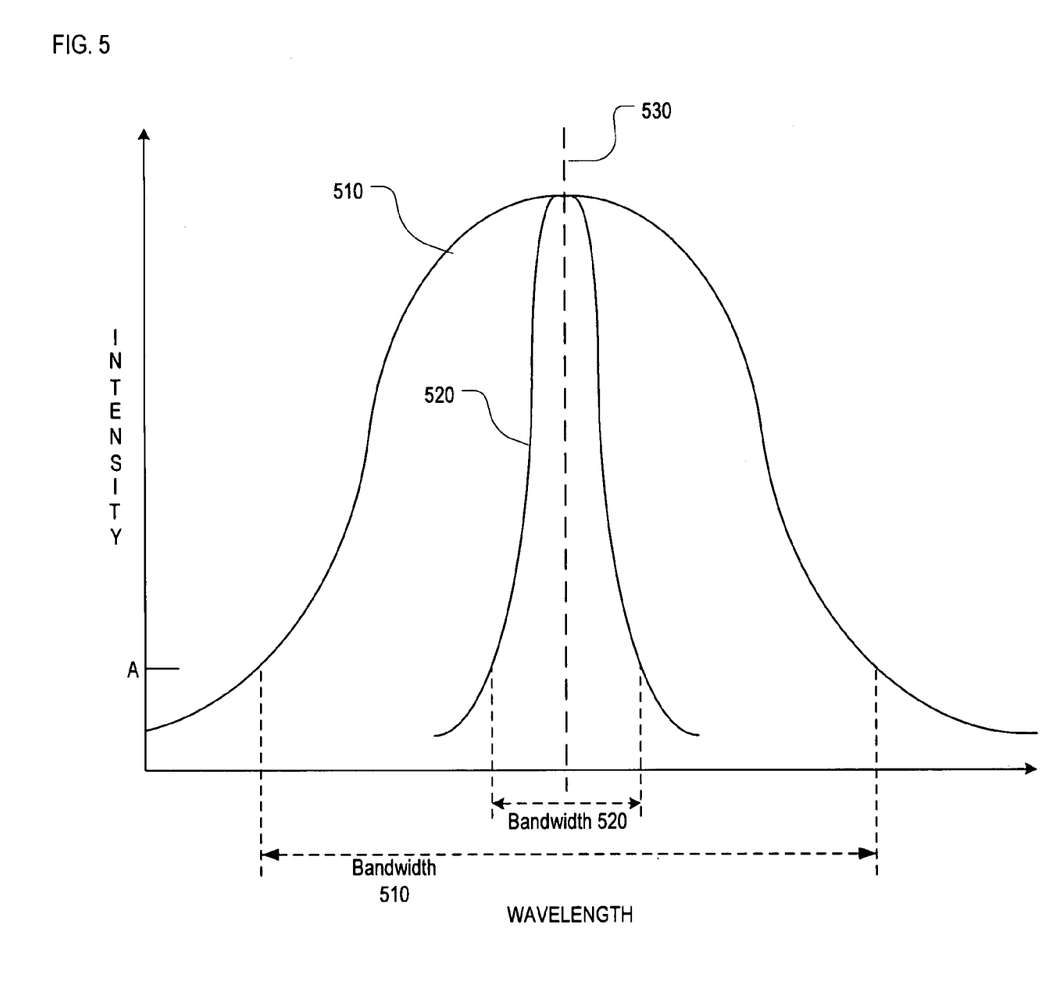
FIG. 5 depicts a representative spectral bandwidth for a conventional VCSEL, and for a narrow spectrum light source that incorporates a VCSEL in accordance with the illustrative embodiment of the present invention.

FIG. 5 illustrates the narrowing effect on the spectral bandwidth of VCSEL 100, wherein curve 510 depicts a representative emission spectra of VCSEL 100 and curve 520 depicts a representative emission spectra of NSLS 300, which incorporates VCSEL 100. The bandwidth of each of the emission spectra is defined based on a minimum output intensity A. As is evident in FIG. 5, the spectral bandwidth of NSLS 300 is narrower than that of VCSEL 100. The spectral bandwidth of curve 520 is actually far narrower, relative to curve 510, than is depicted in FIG. 5. The intent of the Figure is simply to illustrate the effect.

It is notable that spectral bandwidth of NSLS 300 is determined by the coupling coefficient between the port and loop waveguides. That is, spectral bandwidth is determined primarily by the gap between the port waveguide and the loop waveguide (e.g., see FIG. 2, gap G). Generally, a small coupling coefficient (i.e., a large gap) yields a relatively smaller bandwidth. Conversely, a large coupling coefficient (i.e., a small gap) yields a relatively larger bandwidth.

Several aspects of the manufacture of NSLS 300 are now addressed.

Light coupling. Light must be coupled from VCSEL 100 to waveguide 350. This can be accomplished by either butt-coupling the output of the VCSEL to the waveguide or via the technique disclosed in U.S. Pat. No. 7,250,317 to Heideman, which is incorporated by reference herein. That patent describes the formation of a concave reflector that is disposed in-plane with respect to a waveguide. The reflector receives an out-of-plane beam of light and directs it into the co-planar waveguide.

Tuning. As is well known to those skilled in the art, the resonant wavelength of loop waveguide 356 is primarily a function of the optical path length in the loop; that is, the circumference of the loop. To manufacture a loop waveguide that has a desired resonant frequency and to do so on a repeatable basis and in the context of commercial-scale processing is virtually impossible. Therefore, it is advantageous to be able to actively tune the resonant frequency of the ring resonator.

Tuning is typically performed thermo-optically or electro-optically, in known fashion. Briefly, thermo-optic tuning requires a heater, typically an electrically/thermally conductive element. The heater is disposed near loop waveguide 356. A change in temperature of the loop waveguide will cause a change in the size in the loop and, hence, a change in the optical path length. Since the resonant wavelength is dependent on optical path length, a change in loop size causes a change in the resonant wavelength. For electro-optic tuning, a layer of material is added to loop waveguide. The added material has a property whereby upon the application of an electric field, the refractive index of the loop waveguide changes. Suitable electro-optic materials include, without limitation, zinc-oxide (ZnO), lead-zirconium titanate (PZT), lanthanum-doped PZT (PLZT), barium titanate, lithium niobate, liquid crystals, and electro-optic polymers. A change in refractive index will change the optical path length and, therefore, change the resonant frequency.

Materials selection. As previously noted, in a preferred material system, waveguides 350, 352, 354, 362, and loop waveguide 356 comprise a multilayer waveguide having an inner core of stoichiometric silicon oxide ($SiO_2$), an outer core of stoichiometric silicon nitride ($Si_3N_4$), and a cladding formed from a material (e.g., silicon dioxide, etc.) having an index of refraction that is lower than that of the outer core. Waveguides formed from these materials, which are suitable for use in conjunction with NSLS 300, are described in U.S. Pat. No. 7,146,087 to Heideman et al., which is incorporated by reference herein.

To promote efficient coupling between disparate optical elements (e.g., a VCSEL and the waveguides), attention should be paid to the numerical apertures of the elements. As a consequence, in some embodiments, the numerical aperture of the port waveguides is adapted to the numerical aperture of the VCSEL. In some embodiments, that is accomplished for the preferred material system by tapering the nitride layers (of the port waveguides). The tapering should be adiabatic to avoid reflections and/or scatter losses with the tapered section.

In some other embodiments, other materials are used for closed loop waveguide 356 and linear waveguides 350, 352, 354, and 362. It is notable that a greater choice of materials is available when the closed loop waveguide and the linear waveguides are formed from different materials. In particular, as previously described, to create a small loop, a large dielectric contrast is required. But the same requirement is not necessarily imposed on the linear waveguides. Furthermore, the operating frequency of the VCSEL will dictate materials selection. To the extent that the VCSEL is operating at a wavelength other than 850 nanometers, other materials will be suitable for use as waveguide for NSLS 300. Those skilled in the art will be able to select materials suitable for use as loop waveguide 356 and linear waveguides 350, 352, 354, and 362 as a function of application specifics.

It will be understood that other arrangements of linear waveguides can be used in conjunction with the narrow spectrum light source. Furthermore, to the extent that a material system is used that does not achieve the performance of the system described in U.S. Pat. No. 7,146,087, it might be desirable to modify the arrangement that is shown for the illustrative embodiment. The reason for the modification is that it might not be possible to fabricate a small enough ring resonator to obtain a suitably large free spectral range (i.e., large enough to avoid problematic side band resonances).

In some embodiments, the modification comprises coupling one or more additional rings in series with the first ring. This results in the "Vernier effect," wherein the effective FSR for the coupled rings are the multiple of the FSR for the individual rings. For example, if two rings, one having an FSR of 2 and the second having an FSR of 3, are coupled together, they will have an effective FSR of 6.

In some additional embodiments, higher order filters (i.e., even more rings) are used, wherein all rings in the filter have the same diameter. This will increase the signal-to-noise ratio of the ring resonator system. When using an uneven number (e.g., 3, 5, etc.) of rings, the same layout can be used as was used in FIGS. 3 and 4. When using an even number of rings, one of the (formerly) linear waveguides must be "looped," as shown in FIG. 6.

Figure 6:
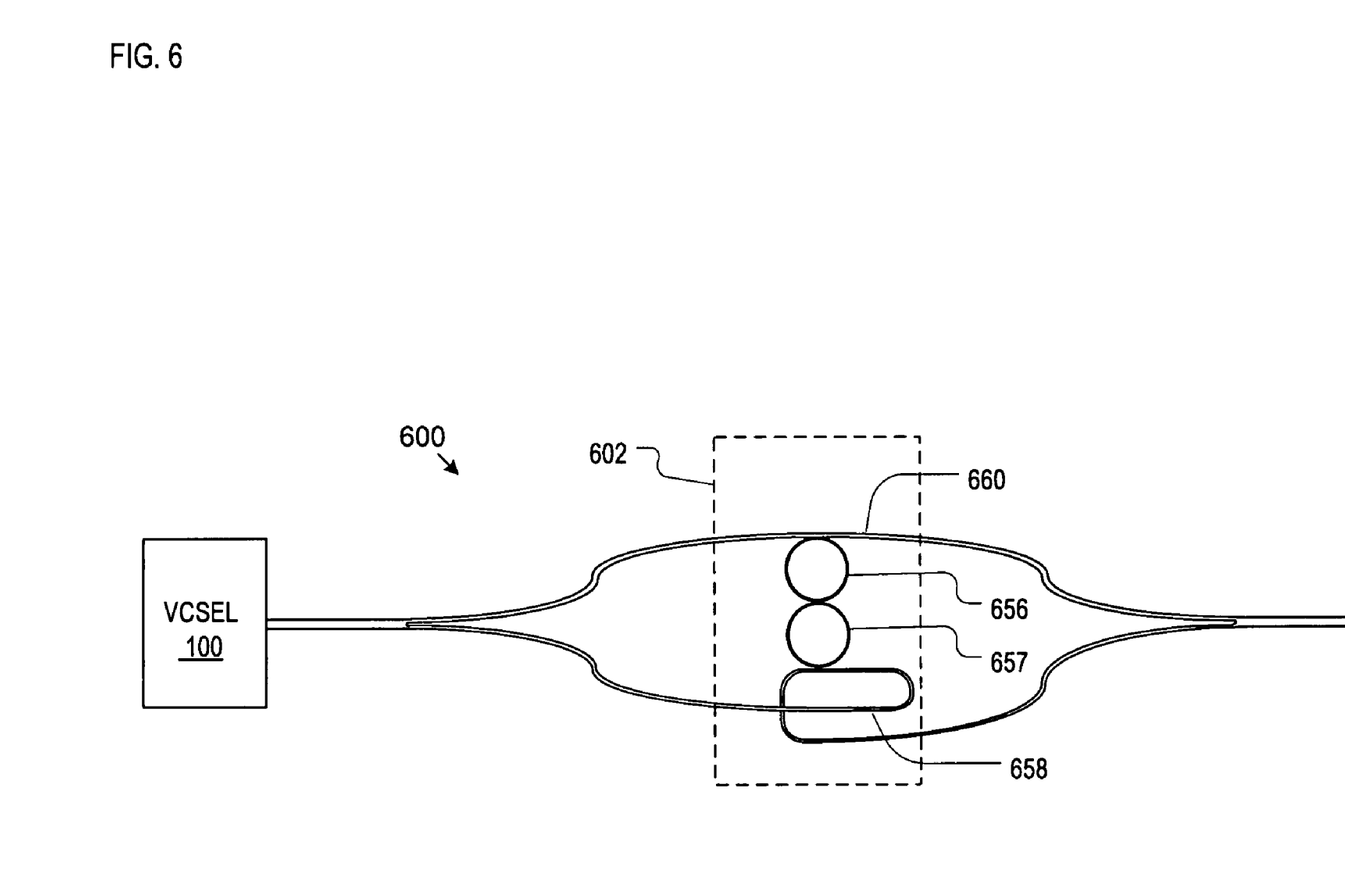
FIG. 6 depicts an alternative embodiment of the narrow spectrum light source of FIG. 3 employing plural ring resonators, wherein an even number of ring resonators is used.

As depicted in FIG. 6, NSLS 600 comprises VCSEL 100 and ring resonator 602. The ring resonator comprises two closed-loop waveguide 656 and 657 and port waveguides 658 and 660. VCSEL 100 and ring resonator 302 are optically coupled to one another via various waveguides (and via the operation of ring resonator 602). Notice that port waveguide 658 loops so that it can continue in the appropriate direction (compare FIG. 3, port waveguide 358).

Figure 7:
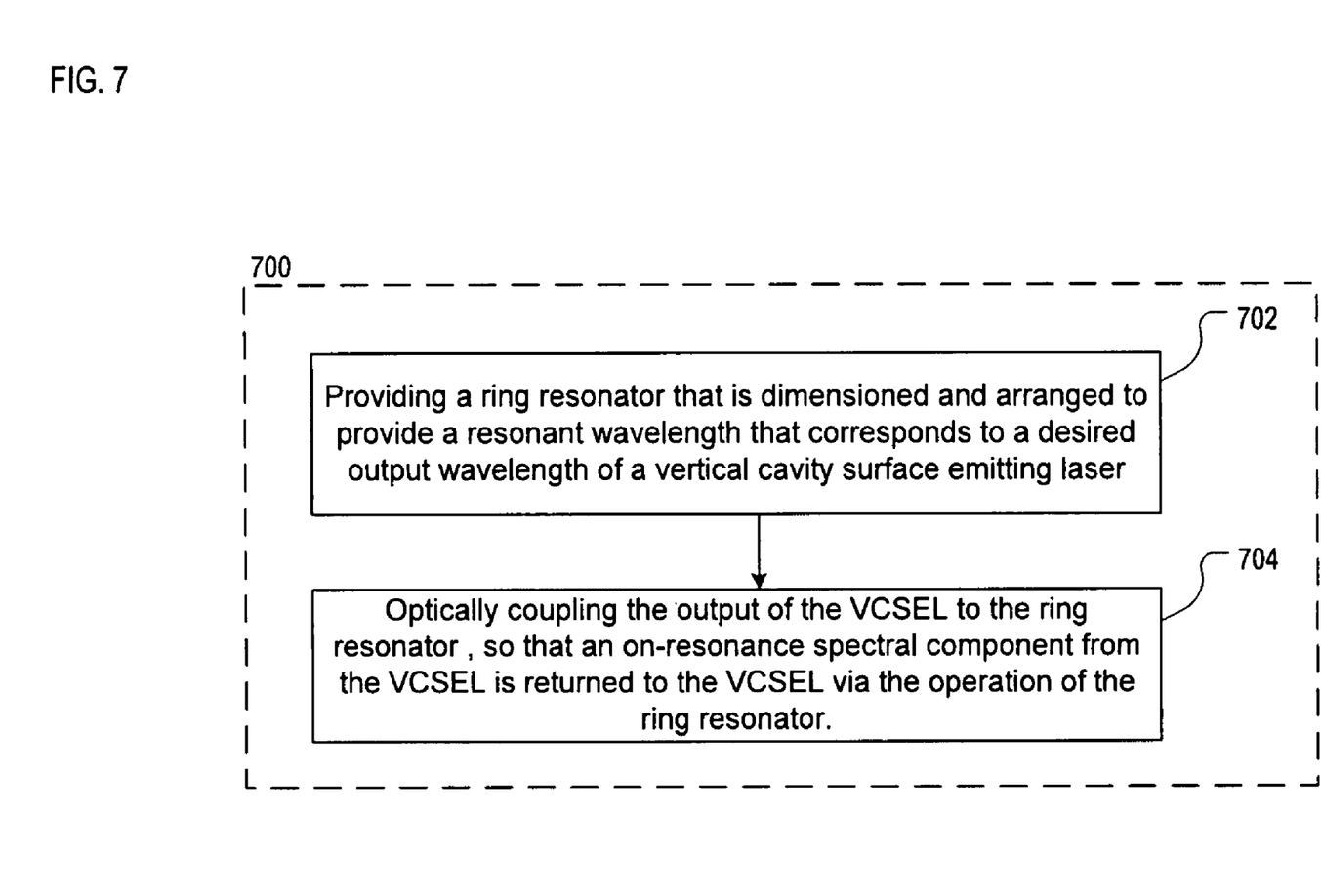
FIG. 7 depicts a method for narrowing the emission spectrum of a VCSEL.

FIG. 7 depicts method 700 in accordance with the illustrative embodiment of the present invention. In accordance with operation 702, an appropriately dimensioned and arranged ring resonator is provided. The ring resonator is sized so that its resonant frequency corresponds to the desired output wavelength of a VCSEL. In some embodiments, this operation further includes the sub-operation of tuning the resonant frequency of the ring resonator (to the extent that there is an offset between the actual resonant resonator and the desired resonant frequency).

Operation 704 recites optically coupling the output of the VCSEL to the ring resonator, such that an on-resonance spectral component that is present in the output beam of the VCSEL is returned to the VCSEL via the operation of the ring resonator.

NSLS 300 will typically be operated so that the resonant frequency of ring resonator 302 is equal to the center wavelength, $\lambda_c$, of the output of VCSEL 100. In some embodiments, however, the resonant frequency of the ring resonator is set to a somewhat different wavelength than the nominal center wavelength of the VCSEL. This provides an ability to tune the VCSEL.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. An apparatus comprising:
   a semiconductor laser that emits light, wherein the light comprises a plurality of spectral components that define a spectral bandwidth of the semiconductor laser; and
   a ring resonator that is optically coupled to the semiconductor laser, wherein:
   (a) the ring resonator comprises waveguides that include a waveguide core having an inner core of stoichiometric silicon oxide ($SiO_2$) and an outer core of stoichiometric silicon nitride ($Si_3N_4$);
   (b) the ring resonator is dimensioned and arranged to selectively return an on-resonance spectral component, from the plurality of spectral components, to the semiconductor laser; and
   (c) the on-resonance spectral component is a desired operating wavelength of the semiconductor laser.

2. The apparatus of claim 1 further comprising a tuning element, wherein the tuning element is operable to change a resonant wavelength of the ring resonator and, hence, to change the wavelength of the on-resonance spectral component.

3. The apparatus of claim 2 wherein the tuning element comprises a heater that is operable to change the temperature of the ring resonator.

4. The apparatus of claim 1 wherein the semiconductor laser is a vertical cavity surface emitting laser ("VCSEL").

5. The apparatus of claim 1 wherein a free spectral range of the ring resonator is at least 4 nanometers.

6. The apparatus of claim 1 wherein the ring resonator comprises a closed-loop waveguide, a first port waveguide and a second port waveguide, wherein the first and second port waveguides are in evanescent-coupling relation with the closed-loop waveguide.

7. The apparatus of claim 1 wherein a diameter of the ring resonator is in a range of about 20 microns to about 100 microns.

8. The apparatus of claim 1 further comprising a splitter-combiner waveguide structure that optically couples the ring resonator to the semiconductor laser, wherein the splitter-combiner waveguide structure comprises first, second, third, and fourth waveguides, wherein:
   (a) the first waveguide branches into the second and third waveguides;
   (b) the second and third waveguides recombine into the fourth waveguide;
   (c) the first, second, third, and fourth waveguides comprise a waveguide core having an inner core of stoichiometric silicon oxide ($SiO_2$) and an outer core of stoichiometric silicon nitride ($Si_3N_4$).

9. The apparatus of claim 8 wherein the first waveguide receives light that is emitted from the semiconductor laser.

10. The apparatus of claim 8 wherein the ring resonator comprises a closed-loop waveguide, and a first port waveguide and a second port waveguide that flank that closed-loop waveguide, wherein:
    (a) the first and second port waveguides are in evanescent-coupling relation with the closed-loop waveguide;
    (b) the second waveguide comprises the first port waveguide; and
    (c) the third waveguide comprises the second port waveguide.

11. The apparatus of claim 9 wherein:
    (a) light emitted from the semiconductor laser traverses a first optical path as it propagates through the first waveguide and through the second waveguide to the closed-loop waveguide;
    (b) light emitted from the semiconductor laser traverses a second optical path as it propagates through the first waveguide and through the third waveguide to the closed-loop waveguide; and
    (c) an optical path length of the first optical path and an optical path length of the second optical path are equal to one another.

12. An apparatus comprising:
    a vertical cavity surface emitting laser ("VCSEL") that emits light having a plurality of spectral components;
    a first ring resonator that is optically coupled to the VCSEL;
    a second ring resonator that is optically coupled to the first ring resonator and the VCSEL, wherein:
    (a) the first ring resonator is dimensioned and arranged to generate a plurality of on-resonance spectral components;
    (b) the second ring resonator is dimensioned and arranged to filter the plurality of on-resonance spectral components and selectively return one of the on-resonance spectral components to the VCSEL, which is a desired operating wavelength of the VCSEL; and the first ring resonator and the second ring resonator each comprise waveguides that include a waveguide core having an inner core of stoichiometric silicon oxide ($SiO_2$) and an outer core of stoichiometric silicon nitride ($Si_3N_4$);

a tuning element, wherein the tuning element is operable to change a wavelength of the on-resonance spectral component.

13. A method comprising:

providing a ring resonator that is dimensioned and arranged to provide a suitable free spectral range and a resonant wavelength that corresponds to a desired output wavelength of a vertical cavity surface emitting laser ("VCSEL"), and wherein the ring resonator comprises waveguides that include a waveguide core having an inner core of stoichiometric silicon oxide ($SiO_2$) and an outer core of stoichiometric silicon nitride ($Si_3N_4$); and optically coupling the output of the VCSEL to a ring resonator so that:

(a) a spectral component of light that is emitted from the VCSEL that has a wavelength that is the same as a resonant wavelength of the ring resonator is returned to the VCSEL via operation of the ring resonator; and (b) spectral components of light that is emitted from the VCSEL that have a wavelength that is not the same as the resonant wavelength of the ring resonator are not returned to the VCSEL, thereby decreasing a spectral bandwidth of the output of the VCSEL.

14. The method of claim 13 further comprising tuning the resonant wavelength of the ring resonator to the desired output of the wavelength of the VCSEL.

15. The method of claim 13 wherein the operation of tuning further comprises changing the temperature of the ring resonator.

16. The method of claim 13 wherein the operation of tuning further comprises changing a refractive index of the ring resonator.

* * * * *